(12) United States Patent
Sugawara et al.

(10) Patent No.: US 8,083,852 B2
(45) Date of Patent: Dec. 27, 2011

(54) SINGLE CRYSTAL GROWTH METHOD AND SINGLE CRYSTAL PULLING APPARATUS

(75) Inventors: Kosei Sugawara, Nishishirakawa (JP); Ryoji Hoshi, Nishishirakawa (JP); Masanori Takazawa, Nishishirakawa (JP); Yuuichi Miyahara, Echizen (JP); Atsushi Iwasaki, Echizen (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 12/922,917

(22) PCT Filed: Mar. 24, 2009

(86) PCT No.: PCT/JP2009/001282
§ 371 (c)(1), (2), (4) Date: Sep. 16, 2010

(87) PCT Pub. No.: WO2009/136464
PCT Pub. Date: Nov. 12, 2009

(65) Prior Publication Data
US 2011/0017125 A1    Jan. 27, 2011

(30) Foreign Application Priority Data
May 8, 2008  (JP) .................................. 2008-122721

(51) Int. Cl.
*C30B 15/06* (2006.01)

(52) U.S. Cl. .............. 117/29; 117/30; 117/217; 117/218

(58) Field of Classification Search .................... 117/29, 117/30, 217, 218
See application file for complete search history.

(56) References Cited

U.S. PATENT DOCUMENTS

| 6,228,165 B1 | 5/2001 | Baba et al. |
| 2002/0020340 A1 | 2/2002 | Dietze et al. |
| 2010/0126408 A1 | 5/2010 | Miyahara et al. |

FOREIGN PATENT DOCUMENTS

| JP | 52-50164 | * 4/1977 |
| JP | 2-111690 | * 4/1990 |
| JP | A-2003-505335 | 2/2003 |
| JP | A-2006-036568 | 2/2006 |
| WO | WO 2008/120435 A1 | 10/2008 |

OTHER PUBLICATIONS

Shimura, "Semiconductor silicon crystal engineering," Maruzen Co., Ltd., pp. 72-73, 1993.

(Continued)

*Primary Examiner* — Bob M Kunemund
(74) *Attorney, Agent, or Firm* — Oliff & Berridge, PLC (57) ABSTRACT

A silicon single crystal growth method of pulling up and growing a single crystal from a melt of a silicon raw material melted in a quartz crucible based on a Czochralski method, the method comprising the steps of: applying a direct current voltage in such a manner that an outer wall of the quartz crucible acts as a positive electrode and an electrode immersed into the melt of the silicon raw material acts as a negative electrode, the immersed electrode being placed separately from a pulling member for pulling the single crystal; and growing the single crystal with the pulling member while passing an electric current through the electrode, and a pulling apparatus thereof.

24 Claims, 5 Drawing Sheets

OTHER PUBLICATIONS

Watanabe et al., "Controlling oxygen concentration and distribution in 200 mm diameter Si crystals using the electromagnetic Czochralski (EMCZ) method," *Journal of Crystal Growth*, vol. 237, pp. 1657-1662, Apr. 2002.

Liu et al., "Investigation of oxygen distribution in electromagnetic CZSi melts with a transverse magnetic filed using 3D global modeling," *Journal of Crystal Growth*, vol. 299, pp. 48-58, Feb. 1, 2007.

International Search Report issued in Application No. PCT/JP2009/001282; Dated Jun. 30, 2009 (With Translation).

* cited by examiner

SINGLE CRYSTAL GROWTH METHOD AND SINGLE CRYSTAL PULLING APPARATUS

TECHNICAL FIELD

The present invention relates to a silicon single crystal growth method and a single crystal pulling apparatus used in the method, and more particularly to a silicon single crystal growth method and a silicon single crystal pulling apparatus capable of improving a yield and productivity of a high quality single crystal.

BACKGROUND ART

Various methods are known for producing silicon single crystals to be used for semiconductor substrates, and examples thereof include the Czochralski method (hereinafter referred to as "the CZ method") which is widely adopted as a rotation pulling method.

Figure 5:
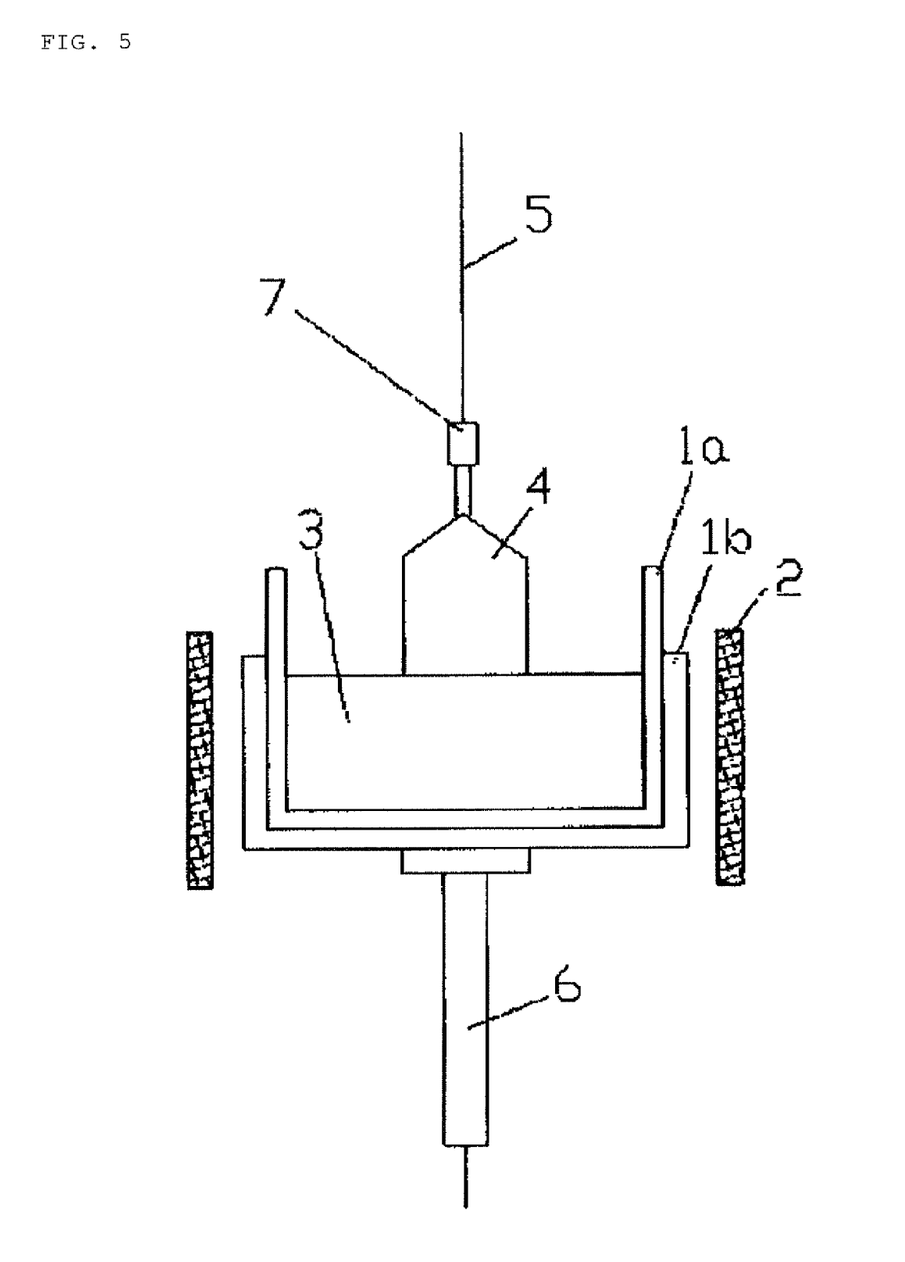
FIG. 5 is a schematic view of an essential constitution of a pulling apparatus adapted to perform a silicon single crystal growth method based on the CZ method.

FIG. 5 is a schematic view of an essential constitution of a pulling apparatus adapted to perform a silicon single crystal growth method based on the CZ method.

The pulling apparatus has an external appearance constituted of a chamber (not shown), and crucibles are disposed at the center of the apparatus. The crucibles have a double structure which is constituted of an inner holding vessel made of quartz that has a bottomed cylindrical shape (hereinafter, simply referred to as "a quartz crucible 1a"), and an outer holding vessel made of graphite that also has a bottomed cylindrical shape, which is adapted to hold an outer surface of the quartz crucible 1a (hereinafter simply referred to as "a graphite crucible 1b").

These crucibles are fixed to an upper end of a supporting shaft 6 so as to allow the crucibles to rotate and to move upwardly and downwardly. A resistance heating heater 2 is disposed outside the crucibles substantially concentrically, and a silicon raw material of a predetermined weight introduced into the quartz crucible is melted by the heater 2 to form a melt 3.

A pulling wire (or a pulling shaft, and hereinafter, combination of these is referred to as "a pulling member 5") configured to rotate about the same axis with the supporting shaft 6 at a predetermined speed in the same direction as or the opposite direction to that of the supporting shaft is disposed along a central axis of the crucible filled with the melt 3, and a seed crystal 7 is held at a lower end of the pulling member 5.

In such a pulling apparatus, the silicon raw material is introduced into the quartz crucible and is melted by the heater disposed around the crucibles in an inert gas atmosphere under reduced pressure, followed by dipping the seed crystal held at the lower end of the pulling member into an surface of the formed melt, and followed by pulling up the pulling member while rotating the crucibles and the pulling member, to grow a crystal from a lower end surface of the seed crystal.

In the CZ method, in order to eliminate dislocations inherently included in the seed crystal as well as dislocations to be brought about by thermal shock upon contact with the melt, after a necking process for once constricting a crystal growing from the lower end surface of the seed crystal into a diameter of about 3 mm, a cone portion for forming a body having a predetermined diameter (a constant diameter portion) is formed, and a silicon single crystal 4 is subsequently grown at a predetermined diameter. During it, the quartz crucible is rotated in the same direction as or the opposite direction to that of the seed crystal. Upon achievement of a targeted length of the single crystal, a tail-constricting operation of its end portion is conducted, thereby completing the growth of the single crystal.

As described above, in case of pulling of the silicon single crystal based on the CZ method, the melt obtained by melting the silicon raw material is held in the quartz crucible among the crucibles having the double structure. When the quartz crucible holds the silicon melt, a quartz crucible surface is subjected to a high-temperature of 1,500° C. or higher, and the subjected time typically comes up to several tens of hours or longer, though such a time varies depending on conditions such as a filled amount of the silicon raw material, a crystal growth rate, and the like.

Furthermore, in order to enhance productivity and a yield of the pulling of the single crystal, there has been recently developed a recharge pulling method (the RCCZ method; see "Semiconductor silicon crystal engineering", pp. 72-73, Fumio Shimura, MARUZEN Co., Ltd., for example) configured to produce a plurality of single crystals from the identical quartz crucible. In the above-described recharge pulling method, a time, during which the quartz crucible is subjected to a silicon melt, may exceed 100 hours.

Typically, brown cristobalite called "a brownish ring" is formed at an inner wall surface of the quartz crucible during the contact of the quartz crucible with the silicon melt in a high-temperature state, and the brownish rings are gradually grown. When the brownish rings are separated from the quartz crucible during a pulling process of the single crystal, the brownish rings obstruct growth of the crystal and cause to generate dislocations of a single crystal into the crystal.

To prevent the generation of dislocations in the single crystal caused by crystallization of the inner surface of the crucible as described above, there has been disclosed a method for generating devitrification at the inner wall surface of the quartz crucible, by causing the quartz crucible to include one kind or two or more kinds of alkali metals of Na, K, and Li, and by applying a direct current voltage of a constant value in such a manner that an outer wall of the quartz crucible acts as a positive electrode, and a seed crystal (a silicon single crystal side, a pulling member side) acts as a negative electrode (see Japanese Patent Laid-open (Kokai) No. 2006-36568, for example).

However, in case of using the above-described method, since the direct current voltage is applied in such a manner that the silicon single crystal side acts as a negative electrode throughout the step of the pulling of the single crystal, there arises a problem such that high concentrations of alkali metals (particularly, Li) are taken in the crystal, and abnormal growth of an oxide film is brought about due to the Li in the crystal in a thermal oxidation treatment after wafer processing.

DISCLOSURE OF INVENTION

It is an object of the present invention to provide a silicon single crystal growth method and a silicon single crystal pulling apparatus in which, in a growth process of the silicon single crystal, an appropriate crystallized layer, i.e., the devitrification can be generated at the inner wall surface of the quartz crucible; thereby the generation of dislocations can be prevented in the single crystal growth; the yield and productivity of the single crystal can be improved; the alkali metals, such as Li, can be prevented from being taken in the silicon single crystal during the pulling of the single crystal; and thereby the abnormal growth of the oxide film can be suppressed in a thermal oxidation treatment after wafer processing.

To solve the foregoing problems, the present invention provides a silicon single crystal growth method of pulling up and growing a single crystal from a melt of a silicon raw material melted in a quartz crucible based on a Czochralski method, the method comprising the steps of: applying a direct current voltage in such a manner that an outer wall of the quartz crucible acts as a positive electrode and an electrode immersed into the melt of the silicon raw material acts as a negative electrode, the immersed electrode being placed separately from a pulling member for pulling the single crystal; and growing the single crystal with the pulling member while passing an electric current through the electrode.

In this manner, when the direct current voltage is applied to pass the electric current through the electrode placed separately from the pulling member for pulling the single crystal, appropriate devitrification can be sufficiently generated at the inner wall surface of the quartz crucible, thereby the generation of dislocations can be prevented in the single crystal growth, and the yield and productivity of the single crystal can be consequently improved. In addition, since the pulling member is not used as an electrode, the alkali metals can be prevented from being taken in the single crystal during the growth of the single crystal, and thereby the abnormal growth of the oxide film can be suppressed in a thermal oxidation treatment after wafer processing.

Moreover, in the growth method of the present invention, the quartz crucible is preferably used which is constituted of the outer wall made of natural quartz containing alkali metals and an inner wall made of synthetic quartz having an alkali metal content lower than that of the natural quartz.

In this way, the quartz crucible can include sufficient alkali metals required for the devitrification, and the inner wall, which comes into direct contact with the melt of the silicon raw material, can have high purity.

Moreover, in the growth method of the present invention, the electric current passing through the electrode can be a constant current of not less than 0.1 mA and not more than 20 mA, or the voltage applied between the electrode and the outer wall of the quartz crucible can be a constant voltage of not less than 0.1 V and not more than 30 V.

When an electric current value or a voltage value is selected in the above-described range so as to be able to generate the appropriate devitrification, the generation of dislocations can be prevented in the single crystal growth, the yield and productivity of the single crystal can be improved, and the alkali metals can be more effectively prevented from being taken in the single crystal during the growth of the single crystal.

Moreover, in the growth method of the present invention, it is preferable that a devitrification area ratio Vc/Vi becomes 20% or more, where Vc is an area devitrified at an inner wall surface of the quartz crucible during the pulling of the single crystal, and Vi is an area where the inner wall surface of the quartz crucible comes into contact with the melt upon the initial stage of melting, to grow the silicon single crystal.

In this way, the generation of dislocations can be more effectively prevented in the single crystal growth, and the yield and productivity of the single crystal can be more effectively improved.

Furthermore, the present invention provides a silicon single crystal pulling apparatus for pulling up and growing a single crystal from a melt of a silicon raw material melted in a quartz crucible based on a Czochralski method, the apparatus comprising at least: the quartz crucible for holding the melt of the silicon raw material; a supporting shaft for supporting the quartz crucible; a pulling member for pulling a seed crystal that is dipped into the melt of the silicon raw material and is pulled while growing the single crystal from a lower end surface of the seed crystal; an electrode immersed into the melt of the silicon raw material, the immersed electrode being placed separately from the pulling member; and a constant current device or a constant voltage device connected so as to be able to apply a voltage between the electrode and an outer wall of the quartz crucible, the device controlling a direct current voltage so that the voltage or an electric current passing between the electrode and the outer wall of the quartz crucible becomes constant, wherein the direct current voltage is applied in such a manner that the outer wall of the quartz crucible acts as a positive electrode.

When the apparatus comprises the above-described electrode and the direct current voltage is applied to pass the electric current through the electrode, appropriate devitrification can be generated at the inner wall surface of the quartz crucible, thereby the generation of dislocations can be prevented in the single crystal growth, and the yield and productivity of the single crystal can be consequently improved. In addition to these, the alkali metals can be prevented from being taken in the single crystal during the growth of the single crystal, and thereby the abnormal growth of the oxide film can be suppressed in a thermal oxidation treatment after wafer processing.

Moreover, it is preferable that the electrode has a base material made of graphite or metal material having a high melting point of 1500° C. or more, and a tip member made of any of silicon single crystal, silicon single crystal coated with SiC, and SiC, the tip member being capable of attaching to the base material, and a side face of the base material and the tip member is protected by being covered with a quartz cylinder.

By the features, contamination of the melt due to the base material can be prevented, a thermal load and a chemical load against the base material can be reduced, and thereby a life (a usage time limit) of the base material can be expanded. In addition, a thermal load against the tip member can be reduced, a melting rate of the tip member to the melt can be lowered, and thereby a life (a usage time limit) of the tip member can be also expanded.

Further, the electrode preferably has a moving mechanism and a contact sensing mechanism, and is immersed into the melt of the silicon raw material.

By the features, the electrode can be immersed into the melt of the silicon raw material throughout the step of the pulling of the silicon single crystal.

Moreover, the constant current device can control the electric current passing between the electrode and the outer wall of the quartz crucible so as to be a constant current of not less than 0.1 mA and not more than 20 mA, or the constant voltage device can control the voltage applied between the electrode and the outer wall of the quartz crucible so as to be a constant voltage of not less than 0.1 V and not more than 30 V.

When the device controls to select an electric current value or a voltage value so as to be able to generate the appropriate devitrification in the above-described range, the generation of dislocations can be prevented in the single crystal growth, the yield and productivity of the single crystal can be improved, and the alkali metals can be more effectively prevented from being taken in the single crystal during the growth of the single crystal.

As mentioned above, when the silicon single crystal is grown in the present invention, the direct current voltage is applied in such a manner that the outer wall of the quartz crucible acts as a positive electrode and the electrode placed separately from the pulling member acts as a negative electrode, and the single crystal is grown with the pulling member while passing the electric current through the electrode. By these features, appropriate devitrification can be generated at the inner wall surface of the quartz crucible, thereby the generation of dislocations can be prevented in the single crystal growth, and the yield and productivity of the single crystal can be consequently improved. In addition to these, the alkali metals can be prevented from being taken in the single crystal during the growth of the single crystal, and thereby the abnormal growth of the oxide film can be suppressed in a thermal oxidation treatment after wafer processing.

BEST MODE FOR CARRYING OUT THE INVENTION

Hereinafter, the present invention will be explained in detail.

As described above, there has been disclosed the method for preventing the generation of dislocations caused by crystallization of the inner surface of the crucible by causing the quartz crucible to include one kind or two or more kinds of alkali metals of Na, K, and Li, and by applying the direct current voltage in such a manner that the outer wall of the quartz crucible acts as a positive electrode, and the seed crystal (a silicon single crystal side, a pulling member side) acts as a negative electrode to generate the devitrification at the inner wall surface of the quartz crucible. However, the present inventors found that when the electric current passes between the silicon single crystal and the outer wall of the quartz crucible, Li contained in the quartz crucible moves to a melt side and is taken in the silicon single crystal negatively charged through the melt.

The present inventors also found that the wafer sliced out of the silicon single crystal in which Li is taken may cause "the abnormal growth of the oxide film" under which the growth rate of the oxide film in a thermal oxidation treatment becomes fast, and that the silicon single crystal which is grown by a conventional pulling method with applying a voltage and which takes Li in may cause the problems of the generation of abnormality in an oxide film thickness and of a lower yield and productivity of the wafer in a thermal oxidation treatment process, in comparison with a normal crystal grown without applying the direct current voltage between the silicon single crystal and the outer wall of the quartz crucible.

Accordingly, in order to prevent the abnormal growth of the oxide film, the concentration of Li taken in the silicon single crystal needs to be on the same level as that of the normal crystal grown without applying the direct current voltage between the silicon single crystal and the outer wall of the quartz crucible.

However, the present inventors revealed that it is difficult to lower the Li concentration to the same level as that of the normal crystal grown without applying the direct current voltage between the silicon single crystal and the outer wall of the quartz crucible, since Li-ions (alkali metal ions) that move from the quartz crucible to the melt to be ionized are drawn to the crystal electrically negatively charged, in the case of passing the electric current through the silicon single crystal throughout the step of the pulling of the single crystal.

In view of this, the present inventors placed the electrode to be immersed into the melt of the silicon raw material separately from the pulling member, applied the direct current voltage in such a manner that this electrode acts as a negative electrode and the outer wall of the quartz crucible acts as a positive electrode, and grew the crystal while passing the electric current through the electrode, i.e., without applying the voltage to the silicon single crystal.

As a result, the present inventors found that also in the event that the direct current voltage is applied in such a manner that the electrode placed separately from the pulling member acts as a negative electrode and the outer wall of the quartz crucible acts as a positive electrode, and that the silicon single crystal is grown while passing the electric current through the electrode, appropriate devitrification can be generated at the inner wall surface of the quartz crucible, thereby the generation of dislocations can be prevented in the single crystal growth, and the yield and productivity of the single crystal can be consequently improved.

The present inventors learned that, on the other hand, in the case of not applying the direct current voltage between the outer wall of the quartz crucible and the electrode placed separately from the pulling member, the appropriate devitrification cannot be sufficiently generated at the inner wall surface of the quartz crucible, the generation of dislocations cannot be sufficiently prevented in the single crystal growth, and consequently, the yield and productivity of the single crystal cannot be sufficiently improved.

Moreover, the present inventors also found that, in the event that the direct current voltage is applied in such a manner that the electrode placed separately from the pulling member acts as a negative electrode and the outer wall of the quartz crucible acts as a positive electrode, and that the silicon single crystal is grown while passing the electric current through the electrode, negative voltage is not applied to the single crystal, and therefore the Li concentration taken in the silicon single crystal can be made lower than the same level as that of the normal crystal grown without applying the direct current voltage between the silicon single crystal and the outer wall of the quartz crucible.

Moreover, the present inventors also learned that, the wafer sliced out of the silicon single crystal does not cause the abnormal growth of the oxide film in a thermal oxidation treatment, the silicon single crystal which has a lower concentration of Li taken in the silicon single crystal than the same level as that of the normal crystal grown without applying the direct current voltage between the silicon single crystal and the outer wall of the quartz crucible and which is grown by applying the direct current voltage in such a manner that the electrode placed separately from the pulling member acts as a negative electrode and the outer wall of the quartz crucible acts as a positive electrode while passing the electric current through the electrode.

The present invention has been brought to completion based on the above-described fining and knowledge. Hereinafter, the present invention will be explained in more detail with reference to the drawings. However the present invention is not restricted thereto.

Figure 1:
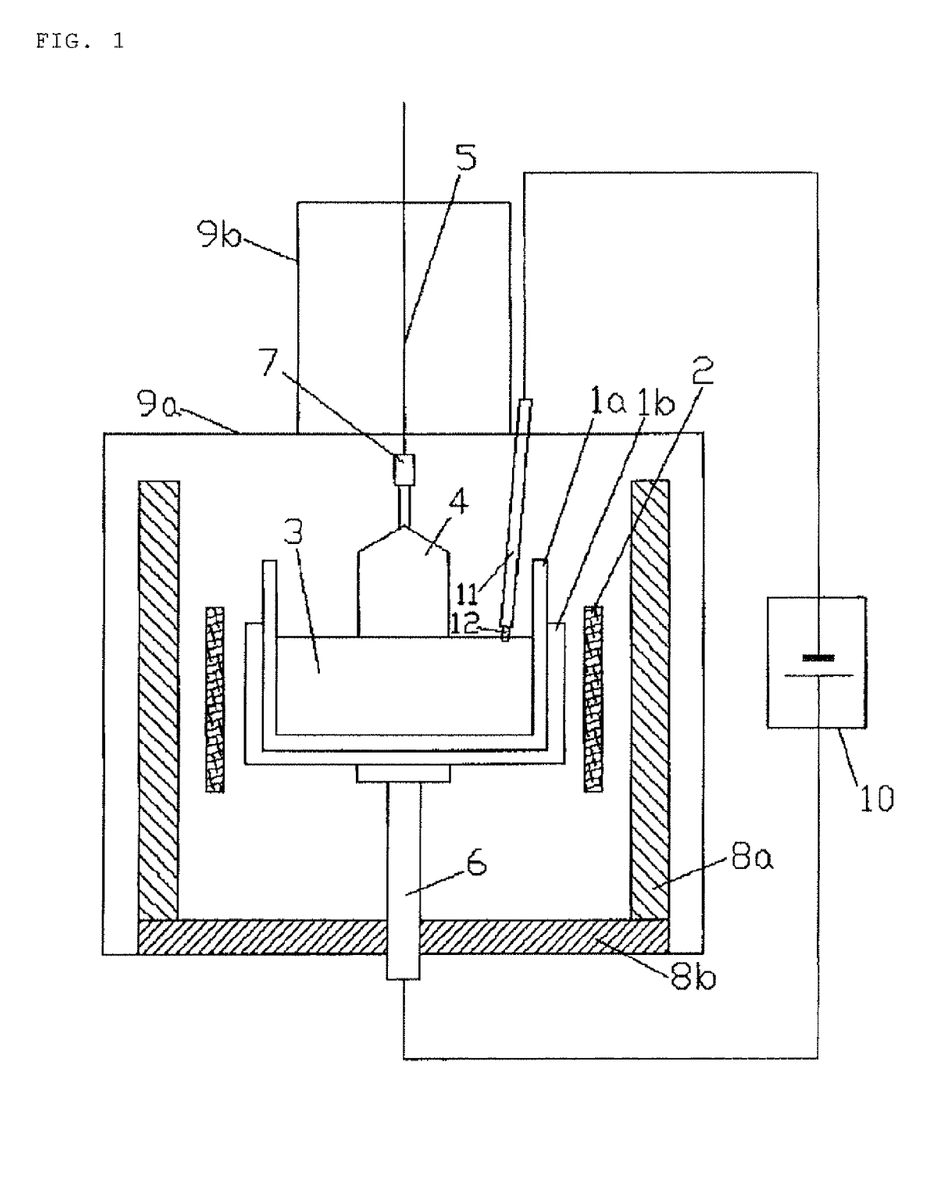
FIG. 1 is a schematic view of an exemplary cross-sectional configuration of the silicon single crystal pulling apparatus according to the present invention.

FIG. 1 is a schematic view of an exemplary cross-sectional configuration of the silicon single crystal pulling apparatus according to the present invention. The pulling apparatus used for the silicon single crystal growth method according to the present invention is described as follows.

The pulling apparatus has an external appearance constituted of a hollow cylinder chamber. The chamber is constituted of a main chamber 9a acting as a lower cylinder, and a pull chamber 9b continuously provided above and fixed to the main chamber 9a and acting as an upper cylinder. The pulling apparatus is provided with the crucibles at the center of the chamber. The crucibles have a double structure which is constituted of an inner holding vessel made of quartz that has a bottomed cylindrical shape (hereinafter simply referred to as "a quartz crucible 1a"), and an outer holding vessel made of graphite that also has a bottomed cylindrical shape, which is adapted to hold an outer surface of the quartz crucible 1a ("a graphite crucible 1b").

A heater 2 is disposed outside the crucibles having the double structure. A heat insulating cylinder 8a is disposed around an outer periphery of the heater 2 concentrically therewith. A heat insulating plate 8b is disposed under the heat insulating cylinder at the bottom of the apparatus. Further, the apparatus is provided with the electrode, which is placed separately from the pulling member 5, has the moving mechanism and the contact sensing mechanism, and is constituted of an electrode 11 (the base material) and an electrode 12 (the tip member). A direct current power supply device 10 for applying a constant direct current or a constant direct current voltage between the crucibles supported by the supporting shaft 6 and the electrode is installed.

The silicon raw material of a predetermined weight is introduced into the quartz crucible and is melted to form the melt 3. The seed crystal 7 is immersed into a surface of the formed melt 3, and then the pulling member 5 is pulled upwardly while rotating the crucibles and the pulling member 5 so that the silicon single crystal 4 is grown from a lower end surface of the seed crystal 7.

As described above, when the direct current voltage is applied in such a manner that the electrode placed separately from the pulling member acts as a negative electrode and the outer wall of the quartz crucible acts as a positive electrode, appropriate devitrification can be generated at the inner wall surface of the quartz crucible, thereby the generation of dislocations can be prevented in the single crystal growth, and the yield and productivity of the single crystal can be consequently improved. In addition to these, the alkali metals can be prevented from being taken in the single crystal during the growth of the single crystal, and thereby the abnormal growth of the oxide film can be suppressed in a thermal oxidation treatment after wafer processing.

In this case, the electrode can have the base material made of graphite or metal material having a high melting point of 1500° C. or more (e.g., tungsten, molybdenum, or the like), and the tip member made of any of silicon single crystal, silicon single crystal coated with SiC, and SiC, the tip member being capable of attaching to the base material, and the side face of the base material and the tip member is protected by being covered with a quartz cylinder.

By the features, contamination of the melt due to the electrode can be prevented, a thermal load and a chemical load against the base material can be reduced, and thereby the life (the usage time limit) of the base material can be expanded. In addition, a thermal load against the tip member can be reduced, a melting rate of the tip member to the melt can be lowered, and thereby the life (the usage time limit) of the tip member can be also expanded.

Further, the electrode can have the moving mechanism and the contact sensing mechanism, and be immersed into the melt of the silicon raw material.

By the features, the electrode can continue to be immersed into the melt of the silicon raw material at a certain depth throughout the step of the pulling of the single crystal. That is, the melt of the silicon raw material is gradually decreased by the growth of the single crystal, and a position of the melt surface can be kept constant by pushing up the crucibles for the decrease, whereas the position of the melt surface is not necessarily completely constant due to a variation of a diameter of the grown single crystal and a variation of a diameter of the crucibles, or the like. Even in this case, however, the moving mechanism and the contact sensing mechanism of the electrode enable the electrode to continue to be immersed at a predetermined depth.

Moreover, the direct current power supply device (the constant current device) can control the electric current passing between the electrode and the quartz crucible so as to be a constant current of not less than 0.1 mA and not more than 20 mA, more preferably not less than 0.5 mA and not more than 4 mA.

When the device controls to select the electric current value in the above-described range so as to be able to generate the appropriate devitrification at the quartz crucible, the generation of dislocations can be prevented in the single crystal growth, the yield and productivity of the single crystal can be improved, and the alkali metals can be prevented from being taken in the single crystal during the growth of the single crystal.

Moreover, the direct current power supply device (the constant voltage device) can control the voltage applied between the electrode and the quartz crucible so as to be a constant voltage of not less than 0.1 V and not more than 30 V, more preferably not less than 0.5 V and not more than 5 V.

When the device controls to select the voltage value in the above-described range so as to be able to generate the appropriate devitrification at the quartz crucible, the generation of dislocations can be prevented in the single crystal growth, the yield and productivity of the single crystal can be improved, and the alkali metals can be prevented from being taken in the single crystal during the growth of the single crystal.

Next, hereinafter, an example of the silicon single crystal growth method according to the present invention will be explained. However the present invention is not restricted thereto.

In the silicon single crystal growth method of pulling up and growing the single crystal from the melt of the silicon raw material melted in the quartz crucible based on the Czochralski method, the direct current voltage is applied in such a manner that the outer wall of the quartz crucible acts as a positive electrode and the electrode immersed into the melt of the silicon raw material acts as a negative electrode, the immersed electrode being placed separately from the pulling member for pulling the single crystal when pulling up and growing the silicon single crystal; and the single crystal is grown with the pulling member while passing the electric current through the electrode.

The method according to the present invention as described above can be implemented, for example, by using the above-described apparatus.

As described above, when the direct current voltage is applied in such a manner that the electrode placed separately from the pulling member acts as a negative electrode and the outer wall of the quartz crucible acts as a positive electrode, appropriate devitrification can be generated at the inner wall surface of the quartz crucible, thereby the generation of dislocations can be prevented in the single crystal growth, and the yield and productivity of the single crystal can be consequently improved. In addition to these, the alkali metals can be prevented from being taken in the single crystal during the growth of the single crystal, and thereby the abnormal growth of the oxide film can be suppressed in a thermal oxidation treatment after wafer processing.

In this case, the quartz crucible can be used which is constituted of the outer wall made of natural quartz containing alkali metals and the inner wall made of synthetic quartz having an alkali metal content lower than that of the natural quartz.

In this way, the quartz crucible can include sufficient alkali metals required for the devitrification, and the inner wall, which comes into direct contact with the melt of the silicon raw material, can have high purity. Thus, an amount of the alkali metals included in the whole of the quartz crucible can be adjusted, and thereby the alkali metals can be more effectively prevented from being taken in the silicon single crystal.

The alkali metals in the natural quartz refer to one kind or two or more kinds of Na, K, and Li, and the total content of the alkali metals of the synthetic quartz is preferably within a range of 0.01 ppm to 10 ppm, and more preferably 0.01 ppm to 5 ppm.

The electric current passing between the electrode and the quartz crucible can be a constant current of not less than 0.1 mA and not more than 20 mA, more preferably not less than 0.5 mA and not more than 4 mA.

In this manner, when the value of the electric current passing between the electrode and the quartz crucible is a value where the appropriate devitrification is generated at the quartz crucible, the generation of dislocations can be prevented in the single crystal growth, the yield and productivity of the single crystal can be improved, and the alkali metals can be prevented from being taken in the single crystal during the growth of the single crystal.

Moreover, the voltage applied between the electrode and the quartz crucible can be controlled to be a constant voltage of not less than 0.1 V and not more than 30 V, more preferably not less than 0.5 V and not more than 5 V.

In this manner, when the value of the voltage applied between the electrode and the quartz crucible is a value where the appropriate devitrification is generated at the quartz crucible, the generation of dislocations can be prevented in the single crystal growth, the yield and productivity of the single crystal can be improved, and the alkali metals can be prevented from being taken in the single crystal during the growth of the single crystal.

In this case, with regard to the electric current value or the voltage value to generate appropriate devitrification at the quartz crucible, it is preferable that the silicon single crystal is grown at such an electric current value or a voltage value that the devitrification area ratio Vc/Vi becomes 20% or more, where Vc is an area devitrified at the inner wall surface of the quartz crucible during the pulling of the single crystal, and Vi is an area where the inner wall surface of the quartz crucible comes into contact with the melt upon the initial stage of melting.

In this way, the generation of dislocations in the single crystal can be more surely prevented.

EXAMPLE

Next, the present invention will be explained in more detail with reference to Examples and Comparative Examples, but the present invention is not restricted thereto.

Example 1

The pulling apparatus shown in FIG. 1 was used to fill a silicon raw material of 150 kg into the quartz crucible having an inner diameter of 600 mm, and to form the melt, followed by pulling up and growing the silicon single crystal having a diameter of 200 mm. The quartz crucible having a Li content of 0.5 ppm was used. The electrode was used in which the base material was made of graphite, the tip member was made of silicon single crystal, and the side face of the base material and the tip member was protected by being covered with the quartz cylinder. The direct current voltage was applied in such a manner that the outer wall of the quartz crucible acted as a positive electrode, and the silicon single crystal was pulled while controlling the electric current passing between the electrode and the outer wall of the quartz crucible so as to be constantly 2.0 mA. In this case, the voltage was 2.0 V to 6.0 V.

Thereafter, the single crystal yields; the devitrification area ratios at the quartz crucible inner wall; the Li concentrations of the silicon single crystals; and the oxide film thicknesses of those wafers after thermal oxidation, which were sliced out of shoulder portions, central portions, and tail portions of the silicon single crystals, respectively; were measured for three batches, respectively.

Example 2

The pulling apparatus shown in FIG. 1 was used to fill a silicon raw material of 150 kg into the quartz crucible having an inner diameter of 600 mm, and to form the melt, followed by pulling up and growing the silicon single crystal having a diameter of 200 mm. The quartz crucible having a Li content of 0.5 ppm was used. The electrode was used in which the base material was made of graphite, the tip member was made of silicon single crystal, and the side face of the base material and the tip member was protected by being covered with the quartz cylinder.

The direct current voltage was applied in such a manner that the outer wall of the quartz crucible acted as a positive electrode, and the silicon single crystal was pulled while controlling the voltage applied between the electrode and the outer wall of the quartz crucible so as to be constantly 5.0 V. In this case, the electric current was 0.5 mA to 5.0 mA.

Thereafter, the single crystal yields; the devitrification area ratios at the quartz crucible inner wall; the Li concentrations of the silicon single crystals; and the oxide film thicknesses of those wafers after thermal oxidation, which were sliced out of shoulder portions, central portions, and tail portions of the silicon single crystals, respectively; were measured for three batches, respectively.

Here, the process flow to measure the Li concentration will be described below. Namely, the obtained silicon single crystal ingot was sliced into wafers, followed by performing etching (CW), polishing (PW), and the like. Given Li in each wafer moves to the inside of the oxide film and is trapped by a thermal oxidation treatment, therefore the oxidation treatment was subsequently conducted with a heat treatment furnace at 900° C. for 10 minutes to form the oxide film on each wafer, followed by a final measurement of the Li concentration of the oxide film on each wafer by ICP-MS.

Comparative Example 1

In the silicon single crystal growth method for above-described Example, the silicon single crystals, each grown under a condition that the electric current was not passed by an voltage of 0 V between the electrode and the outer wall of the quartz crucible, were also evaluated in the same manner as Example.

Comparative Example 2

In the silicon single crystal growth method for above-described Example, an electric current of 2.0 mA was caused to pass between the electrode and the outer wall of the quartz crucible except for during the pulling of the single crystal, and the silicon single crystals, each grown under a condition that the electric current was not passed by an voltage of 0 V between the electrode and the outer wall of the quartz crucible during the pulling of the single crystal, were also evaluated in the same manner as Example.

Comparative Example 3

In the silicon single crystal growth method for above-described Example, the silicon single crystals, each grown under a condition that an electric current of 2.0 mA was caused to pass between the seed crystal and the outer wall of the quartz crucible by applying the direct current voltage, were also evaluated in the same manner as Example.

Figure 2:
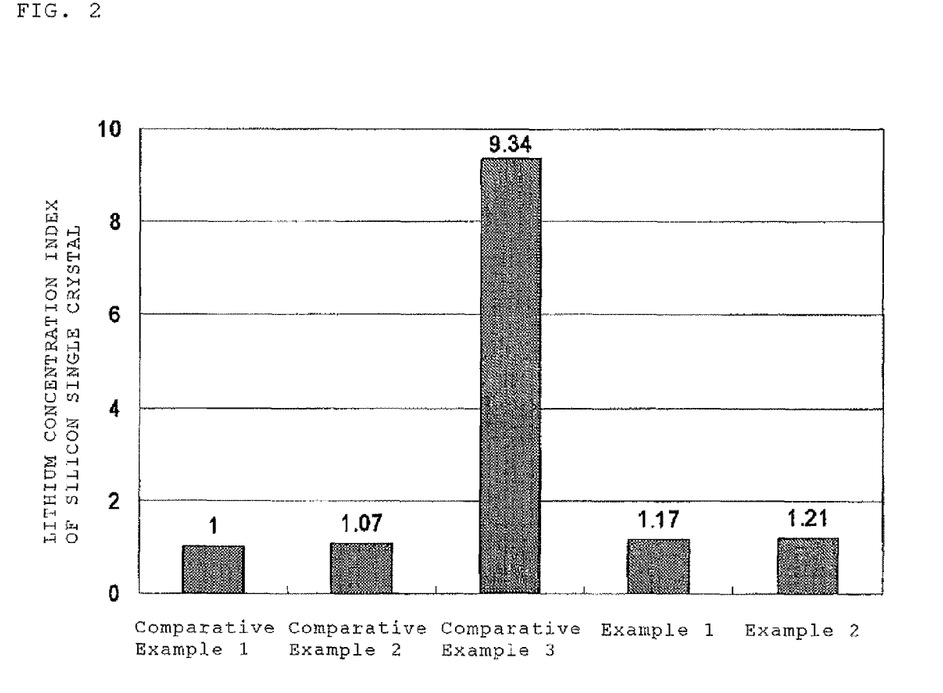
FIG. 2 is a graph of the Li concentration of the silicon single crystal in Examples and Comparative Examples.

FIG. 2 shows a measurement result of the Li concentrations of the silicon single crystals in Examples and Comparative Examples.

The Li concentration of each silicon single crystal in Examples 1 and 2 was notably low as compared to Comparative Example 3, and was on the same level as Comparative Examples 1 and 2.

Figure 3:
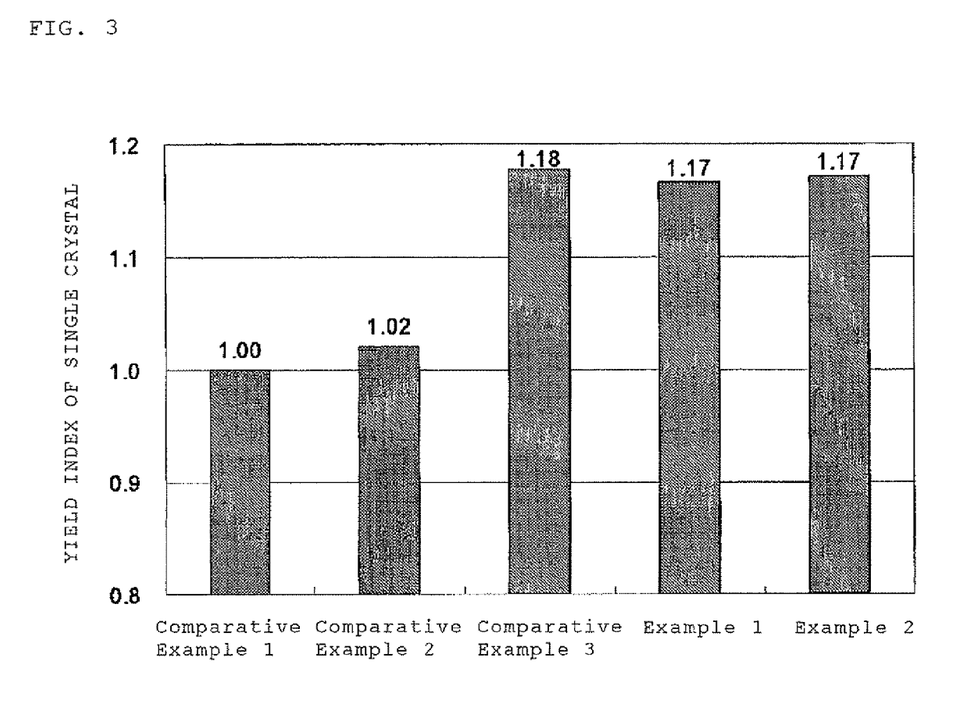
FIG. 3 is a graph of a single crystal yield of Examples and Comparative Examples.

FIG. 3 is a graph of the single crystal yields in Examples and Comparative Examples.

In Examples 1 and 2, it was able to ensure higher yields than that of Comparative Examples 1 and 2. Also, the yields in Examples 1 and 2 were approximately the same as Comparative Example 3.

The devitrification area ratios at the quartz crucible inner wall in Examples 1 and 2 were 60 to 100%, and thus the devitrification sufficient for suppressing the generation of dislocations during the pulling of the silicon single crystal was able to be obtained. It is to be noted that the devitrification area ratios in Comparative Examples 1 and 2 were less than 20%, and thus the devitrification sufficient for suppressing the generation of dislocations in the silicon single crystal was not able to be obtained. The devitrification area ratio in Comparative Example 3 was 55 to 100%.

Figure 4:
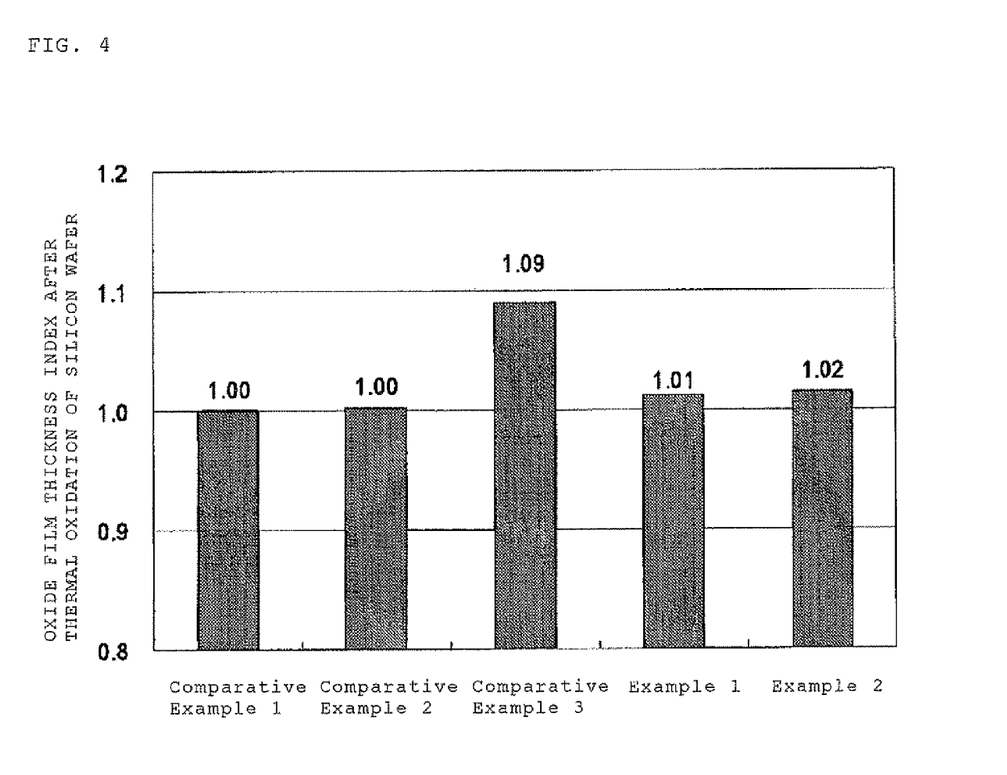
FIG. 4 is a graph of the thickness of the oxide films formed by a thermal oxidation treatment for the wafers sliced out of the silicon single crystal in Examples and Comparative Examples.

FIG. 4 shows a measurement result of the oxide film thicknesses of the wafers sliced out of the silicon single crystals in Examples and Comparative Examples after the thermal oxidation treatment thereto. The oxide film thicknesses of the silicon wafers according to Examples 1 and 2 were thinner than that according to Comparative Example 3, and on the same level as Comparative Examples 1 and 2.

As explained above, by the silicon single crystal growth method and the silicon single crystal pulling apparatus according to the preset invention, in the pulling process of the silicon single crystal, the inner wall surface of the quartz crucible can be adequately devitrified, and Li can be prevented from being taken in the silicon single crystal, and thereby the abnormal growth of the oxide film on the wafer sliced out of the silicon single crystal can be suppressed during a thermal oxidation treatment.

These enable the generation of dislocations to be prevented in the single crystal growth and enable the yield and productivity of the single crystal to be improved, even in an operation of the pulling of the single crystal over a long time. In addition of these, since the abnormal growth of the oxide film on the wafer can be suppressed during a thermal oxidation treatment by preventing the Li intake that exerts a bad influence on forming the oxide film, the present invention can be widely utilized in a field of production of silicon single crystals for semiconductor devices.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A silicon single crystal growth method of pulling up and growing a single crystal from a melt of a silicon raw material melted in a quartz crucible based on a Czochralski method, the method comprising the steps of applying a direct current voltage in such a manner that an outer wall of the quartz crucible acts as a positive electrode and an electrode immersed into the melt of the silicon raw material acts as a negative electrode, the immersed electrode being placed separately from a pulling member for pulling the single crystal; and growing the single crystal with the pulling member while passing an electric current through the electrode.

2. The silicon single crystal growth method according to claim 1, wherein the quartz crucible is used which is constituted of the outer wall made of natural quartz containing alkali metals and an inner wall made of synthetic quartz having an alkali metal content lower than that of the natural quartz.

3. The silicon single crystal growth method according to claim 1, wherein the electric current passing through the electrode is a constant current of not less than 0.1 mA and not more than 20 mA.

4. The silicon single crystal growth method according to claim 2, wherein the electric current passing through the electrode is a constant current of not less than 0.1 mA and not more than 20 mA.

5. The silicon single crystal growth method according to claim 1, wherein the voltage applied between the electrode and the outer wall of the quartz crucible is a constant voltage of not less than 0.1 V and not more than 30 V.

6. The silicon single crystal growth method according to claim 2, wherein the voltage applied between the electrode and the outer wall of the quartz crucible is a constant voltage of not less than 0.1 V and not more than 30 V.

7. The silicon single crystal growth method according to claim 1, wherein the direct current voltage is applied in such a manner that a devitrification area ratio Vc/Vi becomes 20% or more, where Vc is an area devitrified at an inner wall surface of the quartz crucible during the pulling of the single crystal, and Vi is an area where the inner wall surface of the quartz crucible comes into contact with the melt upon the initial stage of melting.

8. The silicon single crystal growth method according to claim 2, wherein the direct current voltage is applied in such a manner that a devitrification area ratio Vc/Vi becomes 20% or more, where Vc is an area devitrified at an inner wall surface of the quartz crucible during the pulling of the single crystal, and Vi is an area where the inner wall surface of the quartz crucible comes into contact with the melt upon the initial stage of melting.

9. The silicon single crystal growth method according to claim 3, wherein the direct current voltage is applied in such a manner that a devitrification area ratio Vc/Vi becomes 20% or more, where Vc is an area devitrified at an inner wall surface of the quartz crucible during the pulling of the single crystal, and Vi is an area where the inner wall surface of the quartz crucible comes into contact with the melt upon the initial stage of melting.

10. The silicon single crystal growth method according to claim 4, wherein the direct current voltage is applied in such a manner that a devitrification area ratio Vc/Vi becomes 20% or more, where Vc is an area devitrified at an inner wall surface of the quartz crucible during the pulling of the single crystal, and Vi is an area where the inner wall surface of the quartz crucible comes into contact with the melt upon the initial stage of melting.

11. The silicon single crystal growth method according to claim 5, wherein the direct current voltage is applied in such a manner that a devitrification area ratio Vc/Vi becomes 20% or more, where Vc is an area devitrified at an inner wall surface of the quartz crucible during the pulling of the single crystal, and Vi is an area where the inner wall surface of the quartz crucible comes into contact with the melt upon the initial stage of melting.

12. The silicon single crystal growth method according to claim 6, wherein the direct current voltage is applied in such a manner that a devitrification area ratio Vc/Vi becomes 20% or more, where Vc is an area devitrified at an inner wall surface of the quartz crucible during the pulling of the single crystal, and Vi is an area where the inner wall surface of the quartz crucible comes into contact with the melt upon the initial stage of melting.

13. A silicon single crystal pulling apparatus for pulling up and growing a single crystal from a melt of a silicon raw material melted in a quartz crucible based on a Czochralski method, the apparatus comprising at least: the quartz crucible for holding the melt of the silicon raw material; a supporting shaft for supporting the quartz crucible; a pulling member for pulling a seed crystal that is dipped into the melt of the silicon raw material and is pulled while growing the single crystal from a lower end surface of the seed crystal; an electrode immersed into the melt of the silicon raw material, the immersed electrode being placed separately from the pulling member; and a constant current device or a constant voltage device connected so as to be able to apply a voltage between the electrode and an outer wall of the quartz crucible, the device controlling a direct current voltage so that the voltage or an electric current passing between the electrode and the outer wall of the quartz crucible becomes constant, wherein the direct current voltage is applied in such a manner that the outer wall of the quartz crucible acts as a positive electrode.

14. The silicon single crystal pulling apparatus according to claim 13, wherein the electrode has a base material made of graphite or metal material having a high melting point of 1500° C. or more, and a tip member made of any of silicon single crystal, silicon single crystal coated with SiC, and SiC, the tip member being capable of attaching to the base material, and a side face of the base material and the tip member is protected by being covered with a quartz cylinder.

15. The silicon single crystal pulling apparatus according to claim 13, wherein the electrode has a moving mechanism and a contact sensing mechanism, and is immersed into the melt of the silicon raw material.

16. The silicon single crystal pulling apparatus according to claim 14, wherein the electrode has a moving mechanism and a contact sensing mechanism, and is immersed into the melt of the silicon raw material.

17. The silicon single crystal pulling apparatus according to claim 13, wherein the constant current device controls the electric current passing between the electrode and the outer wall of the quartz crucible so as to be a constant current of not less than 0.1 mA and not more than 20 mA.

18. The silicon single crystal pulling apparatus according to claim 14, wherein the constant current device controls the electric current passing between the electrode and the outer wall of the quartz crucible so as to be a constant current of not less than 0.1 mA and not more than 20 mA.

19. The silicon single crystal pulling apparatus according to claim 15, wherein the constant current device controls the electric current passing between the electrode and the outer wall of the quartz crucible so as to be a constant current of not less than 0.1 mA and not more than 20 mA.

20. The silicon single crystal pulling apparatus according to claim 16, wherein the constant current device controls the electric current passing between the electrode and the outer wall of the quartz crucible so as to be a constant current of not less than 0.1 mA and not more than 20 mA.

21. The silicon single crystal pulling apparatus according to claim 13, wherein the constant voltage device controls the voltage applied between the electrode and the outer wall of the quartz crucible so as to be a constant voltage of not less than 0.1 V and not more than 30 V.

22. The silicon single crystal pulling apparatus according to claim 14, wherein the constant voltage device controls the voltage applied between the electrode and the outer wall of the quartz crucible so as to be a constant voltage of not less than 0.1 V and not more than 30 V.

23. The silicon single crystal pulling apparatus according to claim 15, wherein the constant voltage device controls the voltage applied between the electrode and the outer wall of the quartz crucible so as to be a constant voltage of not less than 0.1 V and not more than 30 V.

24. The silicon single crystal pulling apparatus according to claim 16, wherein the constant voltage device controls the voltage applied between the electrode and the outer wall of the quartz crucible so as to be a constant voltage of not less than 0.1 V and not more than 30 V.

* * * * *